United States Patent
Boothe et al.

(10) Patent No.: US 9,787,257 B2
(45) Date of Patent: Oct. 10, 2017

(54) AUDIO AMPLIFIER CIRCUIT HAVING INPUTS FOR THREE AUDIO CHANNELS

(71) Applicant: Apple Inc., Cupertino, CA (US)

(72) Inventors: Daniel K. Boothe, San Francisco, CA (US); David C. Breece, III, Palo Alto, CA (US); Adrien N. Haage, San Jose, CA (US)

(73) Assignee: APPLE INC., Cupertino, CA (US)

( * ) Notice: Subject to any disclaimer, the term of this patent is extended or adjusted under 35 U.S.C. 154(b) by 223 days.

(21) Appl. No.: 14/839,782

(22) Filed: Aug. 28, 2015

(65) Prior Publication Data

US 2017/0064483 A1 Mar. 2, 2017

(51) Int. Cl.
*H03F 3/183* (2006.01)
*H04R 5/04* (2006.01)
*H03F 3/217* (2006.01)
*H03F 3/68* (2006.01)

(52) U.S. Cl.
CPC ............ *H03F 3/183* (2013.01); *H03F 3/2173* (2013.01); *H03F 3/68* (2013.01); *H04R 5/04* (2013.01); *H03F 2200/03* (2013.01); *H04R 2420/01* (2013.01); *H04R 2499/11* (2013.01)

(58) Field of Classification Search
None
See application file for complete search history.

(56) References Cited

U.S. PATENT DOCUMENTS

| | | | |
|---|---|---|---|
| 3,497,604 A | 2/1970 | Welsh et al. | |
| 4,443,889 A | 4/1984 | Norgaard | |
| 4,544,895 A | 10/1985 | Stoker | |
| 6,181,796 B1* | 1/2001 | Johnson | H03F 3/68 330/124 R |
| 6,438,237 B1* | 8/2002 | Nakamura | H04R 1/26 381/27 |
| 7,251,333 B2 | 7/2007 | Risch | |
| 7,477,752 B2 | 1/2009 | Kirk | |
| 7,579,815 B2 | 8/2009 | Oehm | |
| 2012/0140930 A1* | 6/2012 | Braun | H04S 5/00 381/17 |

OTHER PUBLICATIONS

"20-W Stereo Digital Audo Power Amplifier With Feedback", Texas Instruments, TAS5704, SLOS563A—Mar. 2008—Revised Aug. 2010, 39 pages.

(Continued)

*Primary Examiner* — Paul Huber
(74) *Attorney, Agent, or Firm* — Blakely Sokoloff Taylor & Zafman LLP

(57) ABSTRACT

An audio amplifier circuit that is to receive three audio channel signals as inputs. A first amplifier has a first pair of outputs one of which produces a first combination sum of the three audio channel signals, and the other produces a second, different combination sum of the three audio channel signals. A second amplifier has a second pair of outputs one of which produces a third, different combination sum of the three audio channel signals and the other produces a fourth, different combination sum of the three audio channel signals. Other embodiments are also described and claimed.

16 Claims, 5 Drawing Sheets

(56) References Cited

OTHER PUBLICATIONS

"Class D Amplifiers: Fundamentals of Operation and Recent Developments", Application Note 3977, Maxim Integrated Products, Inc., copyright Jan. 31, 2007, Internet document at: http://www.maximintegrated.com/en/app-notes/index.mvp/id/3977—Admitted Prior Art, 14 pages.

Honda, Jun, et al., "Application Note AN-1071", *Class D Audio Amplifier Basics, International Rectifier*, El Segundo, CA, Feb. 8, 2005, 14 pages.

\* cited by examiner

AUDIO AMPLIFIER CIRCUIT HAVING INPUTS FOR THREE AUDIO CHANNELS

FIELD

An embodiment of the invention relates generally to multi-channel audio power amplifiers and more particularly to audio power amplifiers that drive three or more speakers in accordance with three or more audio channels, respectively, as input. Other embodiments are also described.

BACKGROUND

Multi-channel audio power amplifiers that can drive two or more speakers, each in accordance with a respective audio channel, are commonplace. Audio amplifiers whose output configuration supports a bridge tied load (BTL) are also advantageous for a variety of reasons. A difficulty that arises however in the context of small form factor consumer electronic devices, such as desktop computers, laptop computers, and tablet computers, is that a class D, multi-channel audio amplifier that can drive three input audio channels into three speakers in BTL configurations has a large power transistor count, making it difficult to integrate into a small housing. That task can be met by a brute force technique of three, class D full bridge amplifiers (each having a BTL output), however such a technique may require too many power transistors which would take up too much space and would be cost prohibitive.

A class D audio power amplifier product is available that has four output nodes, and is programmable into several different output configurations, namely a) 2 channels of BTL outputs (driving two speakers), b) 4 channels of single ended outputs (driving four speakers), and c) 2 channels of single ended outputs and 1 channel in a BTL configuration (driving a total of three speakers). That product however does not support an arrangement where three channels can be driven through three BTL outputs into three speakers, respectively.

SUMMARY

An embodiment of the invention is an audio amplifier circuit that is to receive three audio channel signals as input. A first amplifier has a first pair of outputs, wherein one of the first pair of outputs is to produce a first combination sum of the three audio channel signals, and the other produces a second, different combination sum of the three audio channel signals. A second amplifier has a second pair of outputs, wherein one of the second pair of outputs produces a third, different combination sum of the three audio channel signals and the other produces a fourth, different combination sum of the three audio channel signals. Such an audio amplifier circuit may be used to drive three speakers through a separate BTL output pair for each of the three speakers. Each of the first and second amplifiers may be viewed as having two output legs (yielding a combined four legs of voltage drive). By independently controlling the voltage on each leg of the two amplifiers, three input audio signals can be delivered to three loads, respectively, each in the form of a differential signal across a pair of inputs of its respective load.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, a given figure may be used to illustrate the features of more than one embodiment of the invention, and not all elements in the figure may be required for a given embodiment.

DETAILED DESCRIPTION

Several embodiments of the invention with reference to the appended drawings are now explained. Whenever aspects of the embodiments described here are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
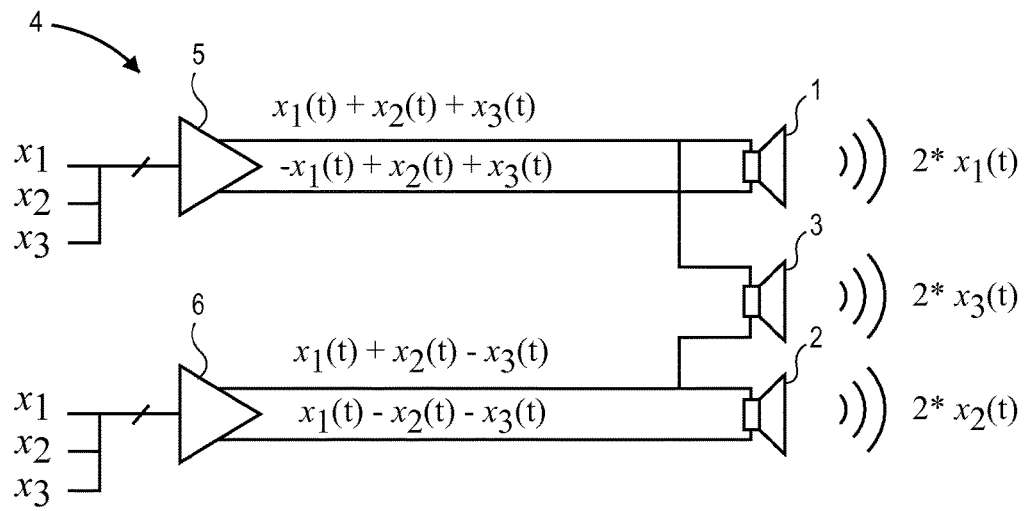
FIG. 1 is a combined block diagram and circuit schematic of an embodiment of an audio amplifier circuit having inputs to receive three audio channels, respectively.

FIG. 1 is a combined block diagram and circuit schematic of an embodiment of an audio amplifier circuit 4 having as inputs three audio channels or signals x1, x2 and x3. All of these audio channels may be independently controlled by an audio processor (not shown) that is upstream of the inputs, e.g. a digital audio processor that decoded the channels x1, x2 and x3 as part of an encoded, multiple audio channel multimedia stream or stored file—see FIG. 6 for an example. In one embodiment, x3 may be a center channel while x1 and x2 are left and right channels, respectively. The center channel x3 could have been derived from the left and right channels or it could have been generated independently of them (by the upstream digital audio processor, for example).

There is a first amplifier 5 having a first pair of outputs, wherein one of the first pair of outputs is to produce a first combination sum (e.g., x1 +x2 +x3) of the three audio channel signals that are provided as inputs of the first amplifier 5. The other one of the first pair of outputs produces a second, different combination sum (e.g., −x1+ x2+x3) of the three audio channel signals. There is also a second amplifier 6 that has a second pair of outputs, wherein one of the second pair of outputs produces a third, different combination sum (e.g., x1+x2−x3) of the three audio channel signals, and the other produces a fourth, different combination sum (e.g., x1−x2−x3) of the three audio channel signals. The amplifiers 5, 6 are power amplifiers that in this example are coupled to drive three independent speakers 1, 3, and 2 in such a way that each of two outputs (from the combined four outputs of the first and second amplifiers 5, 6) is shared by inputs of two of the first, second and third speakers 1, 2, 3. In FIG. 1, the upper output of the amplifier 5 is shared by i) the upper input of the speaker 3 and ii) the upper input of the speaker 1, and the upper output of the amplifier 6 is shared by i) the lower input of the speaker 3 and ii) the upper input of the speaker 2. Each of the first and second amplifiers 5, 6 may have a full bridge output stage that is coupled to drive its floating load (as shown). An example is a class D bridge tied load (BTL) output stage. Each of the speakers 1, 3, 2 may be an electro-dynamic loudspeaker having a respective pair of drive inputs as shown (which may be the two terminals of a driver voice coil of the loudspeaker).

The three signals, x1(*t*), x2(*t*), and x3(*t*), may be viewed as being mixed together, in the time domain, in different combinations, on each of the four legs of the first and second amplifiers 5, 6. In other words, the first, second and third audio channel signals have been embedded into each of the four amplifier output legs, in different combinations. In one embodiment, referring now to FIG. 1, the polarity of x1, x2 and x3 on each output leg of the amplifiers 5, 6 is controlled so as to simultaneously achieve the following three conditions. First, x1(*t*), and not x2(*t*) and not x3(*t*), appears as a differential signal across the pair of input terminals of the speaker 1 (scaled by a factor of two), while x1 is presented common mode at the pair of input terminals of the speaker 2, and at the pair of input terminals of the speaker 3. Similarly, x2(*t*), and not x1(*t*) and not x3(*t*), appears as a differential signal across the pair of input terminals of the speaker 2, while x2 is presented common mode at the pair of input terminals of the speaker 1, and at the pair of input terminals of the speaker 3. Finally, x3(*t*), and not x1(*t*) and not x2(*t*), appears as a differential signal across the pair of input terminals of the speaker 3, while x3 is presented common mode at the pair of input terminals of the speaker 1, and at the pair of input terminals of the speaker 2. In this configuration, each of the three speakers 1, 3, and 2 is being simultaneously driven by its respective audio channel x1, x3 and x2 (with a scaling factor of 2). The solution depicted in FIG. 1 for driving the three speakers 1, 3, and 2 (with their respective audio channels signals x1, x3, and x2, which may if desired be produced independent of each other) is expected to require a smaller power transistor count than the brute force technique of having a separate full bridge (differential output) amplifier coupled to drive the pair of input terminals of each of the speakers 1, 3, 2. Still referring to FIG. 1, in this particular configuration of the audio amplifier circuit 4 in which an amplifier output leg is shared by the inputs of two different speakers, the first pair of outputs of the first amplifier 5 is coupled to drive the respective pair of inputs of the first speaker 1, respectively. The second pair of outputs of the second amplifier 6 is coupled to drive the respective pair of inputs of the second speaker, respectively. Lastly, a) one of the respective pair of inputs of the third speaker 3 is coupled to be driven by one of the first pair of outputs (of the first amplifier 5), and b) the other one of the respective pair of inputs of the third speaker 3 is coupled to be driven by one of the second pair of outputs (of the second amplifier 6).

Figure 2:
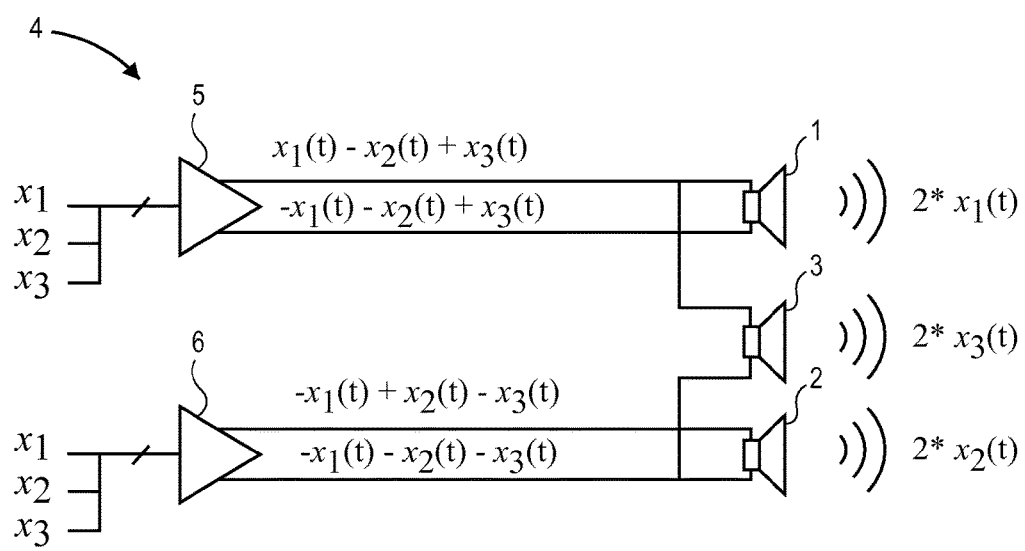
FIG. 2 illustrates another configuration of the audio amplifier circuit of FIG. 1.

Several different configurations of the audio amplifier circuit 4 are possible, in which the coupling of the output legs of the amplifiers 5, 6 to the speakers 1, 2, 3 and the assignment of combinations of the input audio channels are different than shown in FIG. 1, while still producing the same sound output shown in FIG. 1 (from the speakers 1, 2, 3.) The audio amplifier circuit 4 still achieves the same result of each speaker 1, 2, 3 being simultaneously driven by its respective audio channel x1, x2, x3. For example, FIG. 2 shows a configuration where the combination of audio channels appearing on some of the output legs are different than in FIG. 1, but the resulting sound being outputted by the speakers is the same as in FIG. 1, because the coupling (wiring) of the input terminals of the speaker 3 is changed as shown in FIG. 2 (so that the input terminals of the speaker 3 are coupled to a different pair of the output legs than in FIG. 1). As seen in FIG. 2, the amplifiers 5, 6 are coupled to drive the three independent speakers 1, 3, and 2 in such a way that each of two outputs (from the combined four outputs of the first and second amplifiers 5, 6) is shared by inputs of two of the first, second and third speakers 1, 2, 3. In FIG. 2, the upper output of the amplifier 5 is shared by i) the upper input of the speaker 3 and ii) the upper input of the speaker 1, and the lower output of the amplifier 6 is shared by i) the lower input of the speaker 3 and ii) the lower input of the speaker 2.

Figure 3A:
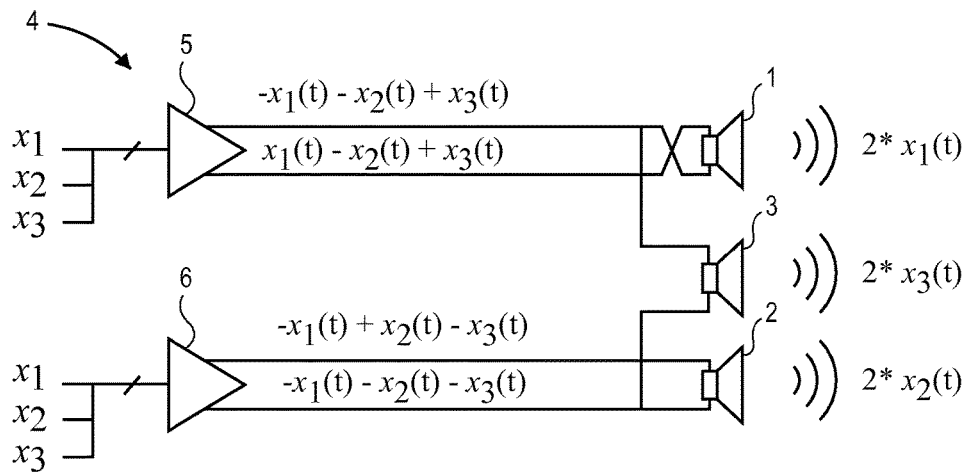
FIG. 3a illustrates yet another configuration of the audio amplifier circuit of FIG. 1

Another configuration is shown in FIG. 3*a*, where in this case the polarity of the input terminals of the speaker 1 as coupled to the first amplifier 5 is reversed (relative to that of FIG. 1 and FIG. 2) but the sound output remains the same. As seen in FIG. 3*a*, the amplifiers 5, 6 are coupled to drive the three independent speakers 1, 3, and 2 in such a way that each of two outputs (from the combined four outputs of the first and second amplifiers 5, 6) is shared by inputs of two of the first, second and third speakers 1, 2, 3. In FIG. 3*a*, the upper output of the amplifier 5 is shared by i) the upper input of the speaker 3 and ii) the lower input of the speaker 1, and the lower output of the amplifier 6 is shared by i) the lower input of the speaker 3 and ii) the lower input of the speaker 2.

Figure 3B:
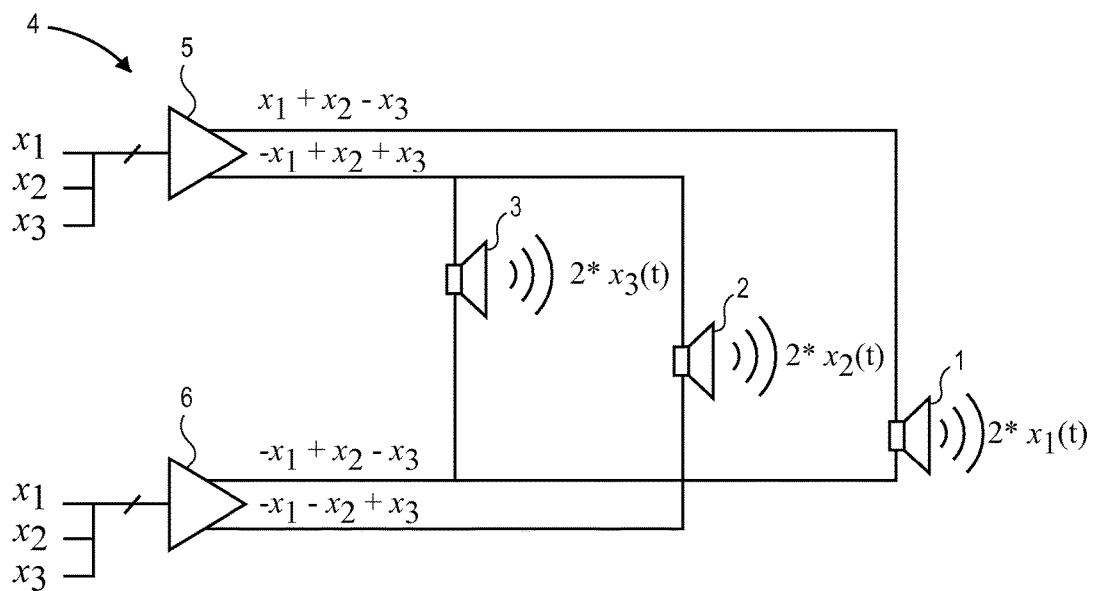
FIG. 3b illustrates yet another configuration of the audio amplifier circuit of FIG. 1.

Yet another configuration is shown in FIG. 3*b*. As seen in FIG. 3*b*, the amplifiers 5, 6 are coupled to drive the three independent speakers 1, 3, and 2 in such a way that each of two outputs (from the combined four outputs of the first and second amplifiers 5, 6) is shared by inputs of two of the first, second and third speakers 1, 2, 3. In FIG. 3*b*, the lower output of the amplifier 5 is shared by i) the upper input of the speaker 3 and ii) the upper input of the speaker 2, and the upper output of the amplifier 6 is shared by i) the lower input of the speaker 3 and ii) the lower input of the speaker 1. At least one other configuration is possible.

In one embodiment of the invention, each output leg of the first amplifier 5 and second amplifier 6 may exhibit a voltage swing that is the sum of the amplitudes of x1, x2, and x3. This means that, as compared to the conventional or brute force technique where each of x1, x2 and x3 has its respective full bridge (BTL-output) amplifier, either the supply voltages have to be increased or the amplitude of one or more of x1, x2, and x3 is decreased. Viewed differently, it is the sum of the amplitudes of the three channels x1, x2 and x3 that should be limited as they appear at the output leg of the amplifier 5 or amplifier 6 (to maintain linear behavior), and not necessarily each individual channel. As an example, if x1 and x2 are loud (and thus contain the majority of the playback power) while x3 is quiet, then the channel amplitudes of x1 and x2 may not need to be limited as much as they would have been had x3 been louder. Note however that for the same loads (impedances), an embodiment of the invention would not consume more power than the brute force technique; it may however need to have either a) a larger supply voltage, such as three times the supply voltage of the brute force technique, or b) a sufficient reduction in the amplitudes of any one or more of the inputs x1, x2 and x3, such as by reducing the amplitudes of x1 and x2 but not that of x3 (in order to keep the same supply voltage).

It should also be noted that, in one embodiment of the invention, each of the first and second amplifiers 5, 6 has common mode output capability. For example, if x1=0 (e.g., the channel is muted), then the average voltage of the two output legs of the amplifier A1 will be the sum of x2+x3 which is non-zero since x2 and x3 are independent audio channels.

Figure 4:
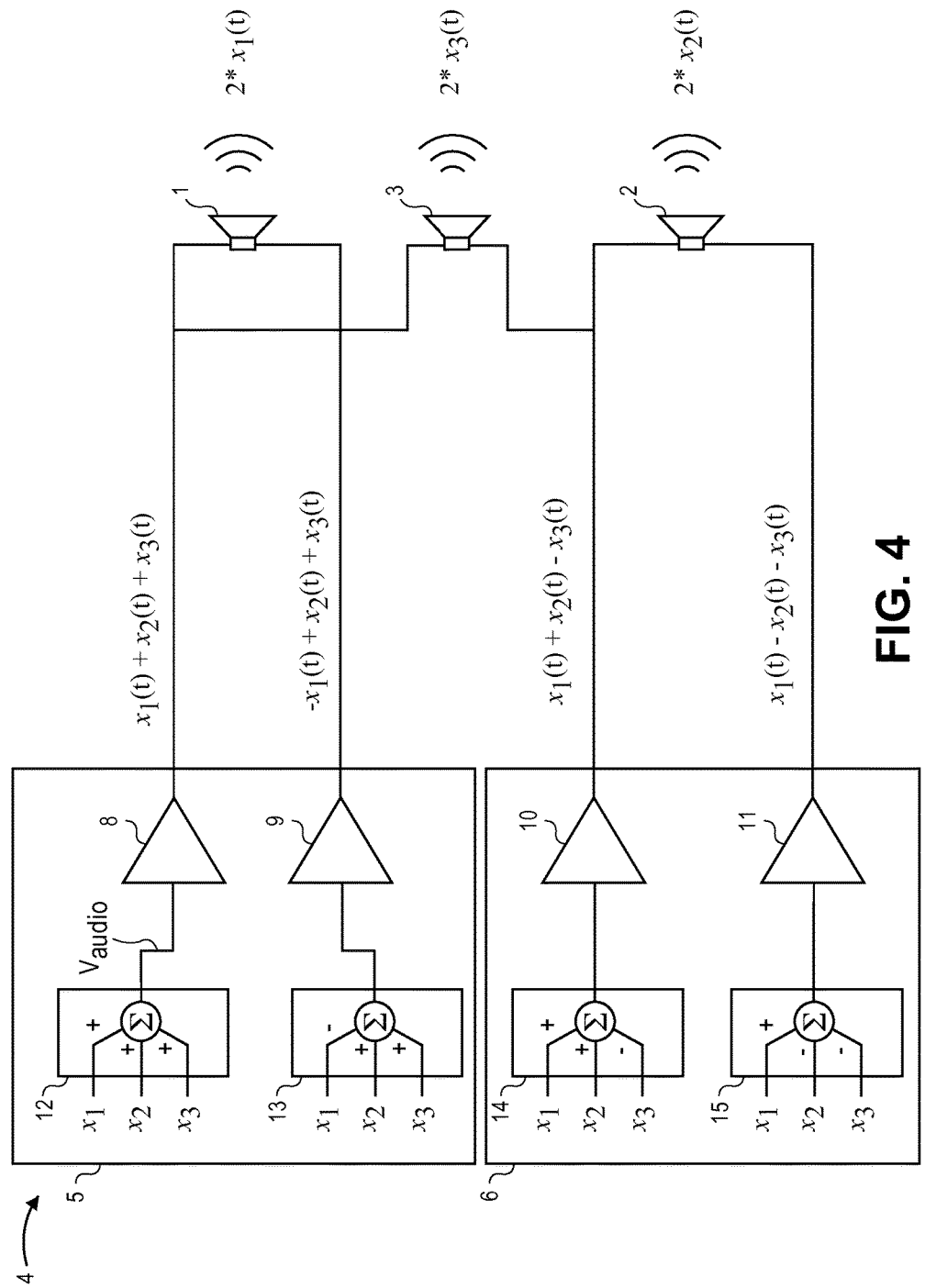
FIG. 4 is a combined block diagram and circuit schematic of the audio amplifier circuit implemented using four half-bridge amplifiers.

Turning now to FIG. 4, this is a combined block diagram and circuit schematic of the audio amplifier circuit 4 that has been implemented using four half bridge output stages 8, 9, 10, 11. More particularly, the first amplifier 5 (see any one of FIG. 1-FIG. 3b) is implemented using a first half bridge output stage 8 and a first input stage 12, where the latter is a summing and differencing amplifier circuit that is to receive the three audio channel signals x1, x2, x3, and provides a first combination thereof to an input of the first half bridge output stage 8 as shown (referenced as a signal Vaudio). The first half bridge output stage 8 has a single ended output, which provides the combination of x1, x2, x3 as Vaudio, defined by the first input stage 12, relative to ground. The second leg of the first amplifier 5 is provided by a single ended output of a second half bridge output stage 9, where the latter has an input that is fed by a second input stage 13. The latter is another summing and differencing amplifier circuit that provides a second, different combination of the three audio channel signals x1, x2, x3. The half bridge output stages 8, 9 provide power gain to drive a speaker load (in this case the input terminals of the speaker 1), while the summing and differencing amplifier circuit (within the input stages 12, 13) need not provide power gain but may be simply voltage signal conditioning circuits.

Referring back to FIG. 1-FIG. 3b, the audio amplifier circuit 4 also has the second amplifier 6, and in FIG. 4 this may be implemented by another pair of half bridge output stage and input stage circuits, namely an input stage 14 (e.g., a summing and differencing amplifier circuit) that feeds an input of a third half bridge output stage 10, while a fourth input stage 15 feeds the input of a fourth half bridge output stage 11. Each output stage 10, 11 may have a single ended output and may also have a single ended input that receives Vaudio from its respective input stage 14, 15.

Note that the configuration of FIG. 4, including the combination of the audio channels x1, x2, x3 that is assigned to each output leg of the audio amplifier circuit 4, is the same as in FIG. 1. The approach of FIG. 4 in which a separate input stage 12, 13, 14, 15 is used to feed a separate half bridge output stage 8, 9, 10, 11 can also be used to implement different configurations of the audio amplifier circuit 4, including those depicted in FIG. 2, FIG. 3a, and FIG. 3b.

Figure 5:
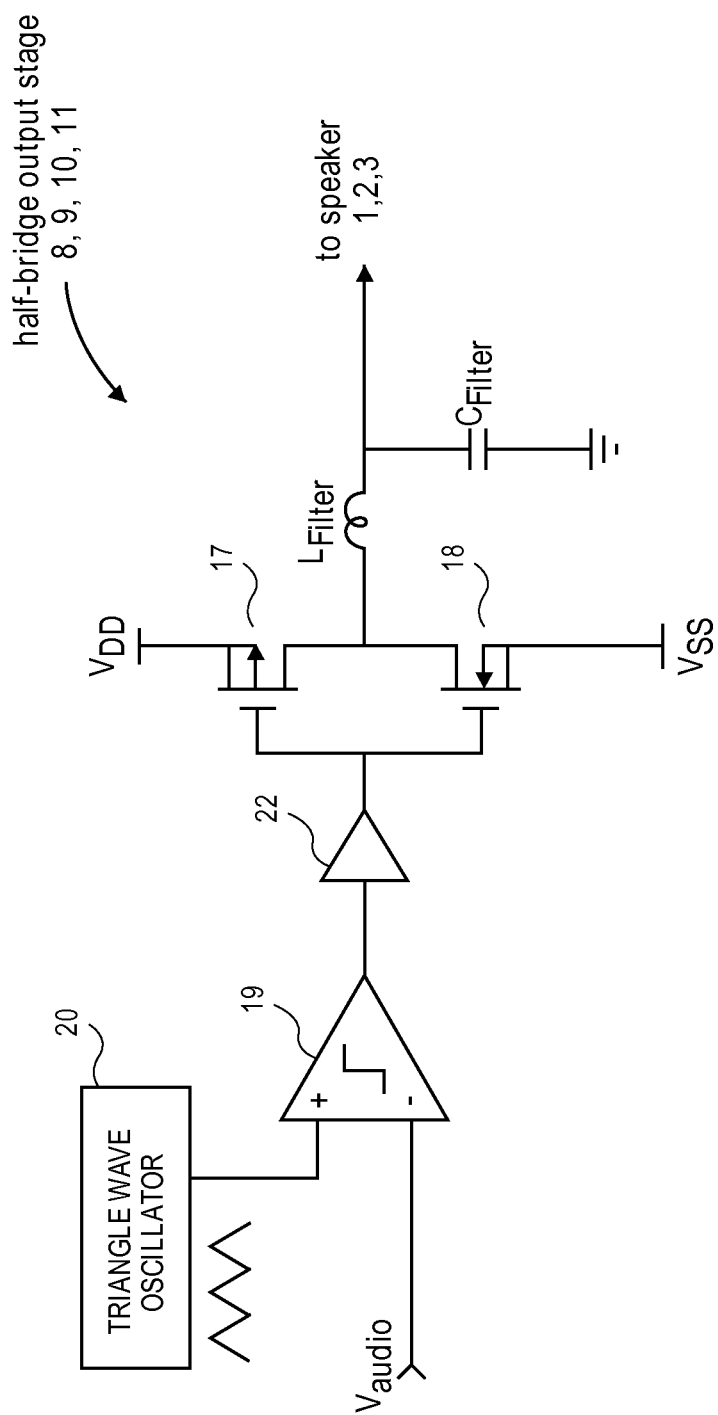
FIG. 5 is a combined block diagram and circuit schematic of an example class D half-bridge output stage.

A combined block diagram and circuit schematic of an example half bridge output stage 8, 9, 10, or 11 is illustrated in FIG. 5. This is a simplified block diagram of a pulse width modulation based half bridge output stage, which is a class D amplifier. Pulse width modulation (PWM) is achieved using a combination of a triangle wave oscillator 20 feeding an input of a comparator 19, while the other input of the comparator 19 receives the audio signal Vaudio. The power transistors 17, 18 are driven by a power transistor driver circuit 22, which responds to the PWM modulated signal by switching on and switching off the power transistors 17, 18 accordingly. The transistors 17, 18 switch an output node alternately to either Vdd or Vss, while the output node voltage is being filtered by a suitable L-C filter stage, having inductor $L_{filter}$ and shunt capacitor $C_{filter}$ as shown. Although not shown, more complex circuit arrangements may be used for the half bridge output stage 8, 9, 10 or 11, and these may include additional circuitry such as feedback circuitry to help regulate the output node voltage, and a filterless class D modulator circuit (which may avoid the need for the L-C filter stage at the output node.) Other half bridge output stage designs are possible, including class D types that use pulse density modulation (PDM) and those that are not class D types.

The summing and differencing amplifier circuit in the input stage 12, 13, 14, or 15 may include an op-amp based analog summing circuit and an op-amp based differential amplifier (or analog substractor). These would operate upon the audio channel signals x1, x2, x3 in the time domain and in analog form, to produce an analog combination of the three audio channel signals at the signal input of a respective half bridge output stage 8, 9, 10, or 11. Alternatively, the summing and differencing amplifier circuit of each input stage 12, 13, 14, or 15 may have a digital signal processor that performs summing and subtraction upon the audio channel signals x1, x2, x3 in digital form (e.g., in the discrete time domain) to produce a digital form of the combination of the three audio channel signals (being the audio signal Vaudio). A digital-to-analog converter that converts the digital form of Vaudio into analog form, at the signal input of one of the half bridge output stages 8, 9, 10, 11 may then be needed, to interface with the example half bridge output stage depicted in FIG. 5 where Vaudio in that case is an analog voltage signal.

Figure 6:
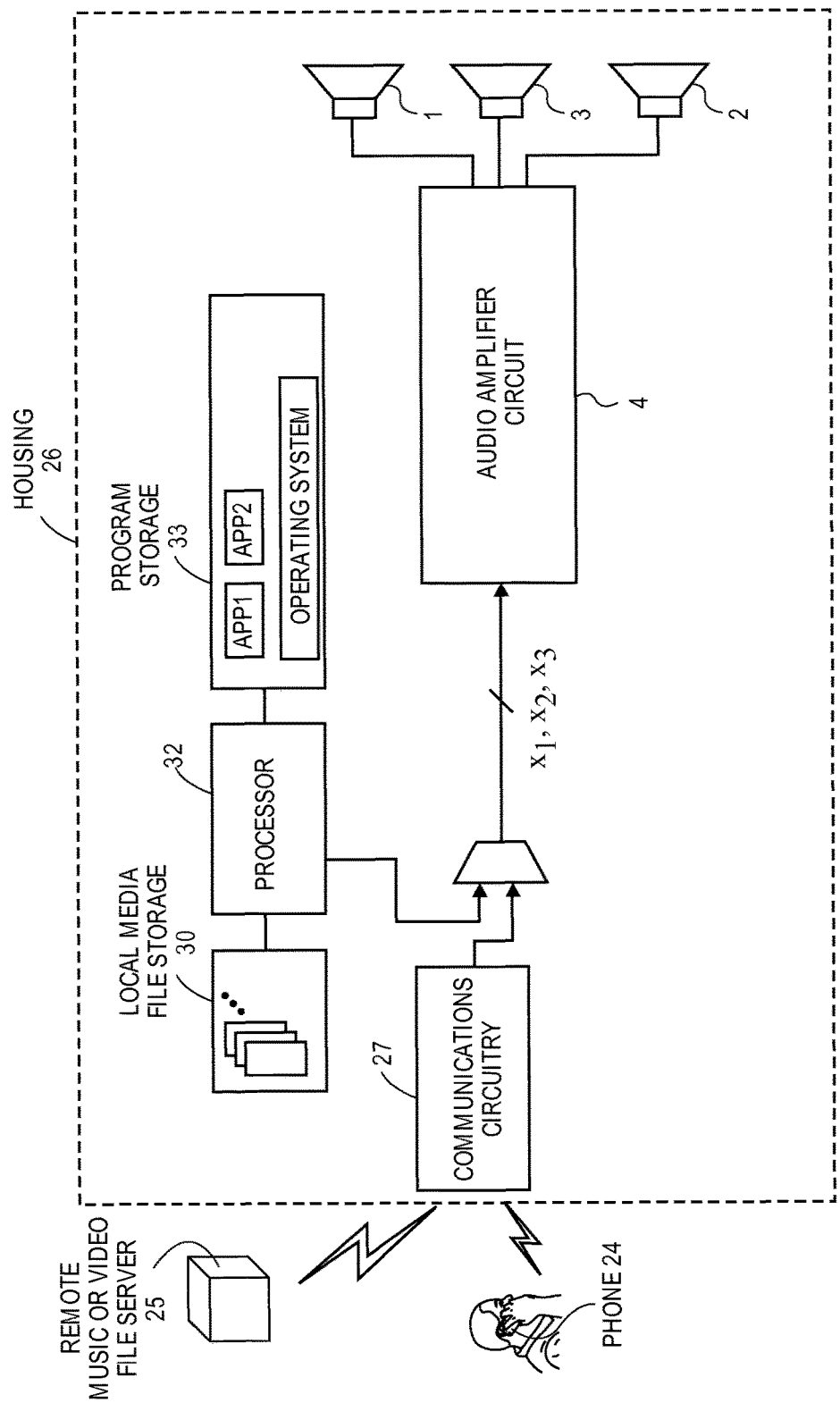
FIG. 6 is a block diagram of relevant parts of an example portable electronic audio device in which the audio amplifier circuit can be implemented.

The audio amplifier circuit 4 described above in its various embodiments provides a solution to the problem of driving three separate speaker loads with three audio channels (all of which may be independent of one another), and doing so in a manner that may reduce the total count of power transistors. The audio amplifier circuit 4 may be used in different types of consumer electronic audio devices. One such device that may benefit specially from the approaches described above is a portable electronic audio device, such as a laptop, smartphone, tablet, portable speaker, or speaker dock which may be a high volume manufacture item that has limited volume within its housing 26 (thereby motivating a circuit design that can reduce the number of large and expensive components such as power transistors). FIG. 6 depicts a block diagram of relevant parts of an example portable electronic audio device, including its housing 26 in which the audio amplifier circuit 4 can be implemented. The housing 26 may be that of a smartphone, laptop, tablet computer, or a speaker dock, to name a few examples. In those instances, the speakers 1, 2, 3 are integrated within the housing 26. In other embodiments, one or more of the speakers 1, 2, 3 may be external speakers, that is external to the housing 26, which are connected to the output legs of the audio amplifier circuit 4 through any suitable audio power cable and connector mechanism.

The inputs (or input signals) to the audio amplifier circuit 4, which include the three audio channel signals x1, x2, x3, may be obtained from communications circuitry 27 which receives a single channel audio signal or a multi-channel audio signal through downlink communications, from a remote music or video file server 25 (e.g., a music or video stream over the Internet). Alternatively, a single channel or multi-channel audio signal may be obtained from a phone 24 of a far-end user that is engaged in a two-way voice communications session with a near-end user (not shown) of the housing 26. The session in that case may be generically referred to as a voice call or it may be a video call. Another possibility for sourcing the multi-channel audio signal (which contains at least x1, x2, x3) is by a processor 32 reading a music or video file that is stored in a local media file storage 30, within the housing 26 for example. The processor 32 may be programmed in accordance with an operating system and any one or more application programs (e.g., app1, app2), which are stored in program storage 33 that is also located within the housing 26. In such instances, a multi-channel audio signal x1, x2, x3 (optionally having additional audio channels) may be provided in discrete time domain to the audio amplifier circuit 4, during either playback or during a call, in order to produce sound through the speakers 1, 2, 3. Details concerning how the three audio channels x1, x2, x3 are processed by the audio amplifier circuit 4 may be in accordance with any of the embodiments described above in connection with FIG. 1-FIG. 5.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For instance, the half bridge output stage depicted in FIG. 5 may have positive and negative voltage supply inputs (Vdd is positive and Vss is negative), but a single ended voltage supply is also possible (where Vdd is positive and Vss is ground or zero volts.) The description is thus to be regarded as illustrative instead of limiting.

What is claimed is:

1. An audio amplifier circuit that is to receive three audio channel signals as inputs, comprising:
    a first amplifier having a first pair of outputs, wherein one of the first pair of outputs is to produce a first combination sum of the three audio channel signals, and the other produces a second, different combination sum of the three audio channel signals; and
    a second amplifier having a second pair of outputs, wherein one of the second pair of outputs produces a third, different combination sum of the three audio channel signals and the other produces a fourth, different combination sum of the three audio channel signals.

2. The audio amplifier circuit of claim 1 in combination with first, second and third speakers each having a respective pair of inputs,
    wherein the first pair of outputs and the second pair of outputs are coupled to drive the respective pairs of inputs of the first speaker, the second speaker, and the third speaker such that each of two outputs, of the first and second pairs of outputs, is shared by inputs of two of the first, second and third speakers.

3. The audio amplifier circuit of claim 1 in combination with first, second and third speakers each having a respective pair of inputs, wherein
    the first pair of outputs is coupled to drive the respective pair of inputs of the first speaker, respectively
    the second pair of outputs is coupled to drive the respective pair of inputs of the second speaker, respectively, and a) one of the respective pair of inputs of the third speaker is coupled to be driven by one of the first pair of outputs, and b) the other one of the respective pair of inputs of the third speaker is coupled to be driven by one of the second pair of outputs.

4. The audio amplifier circuit of claim 1 wherein each of the first and second amplifiers comprises a full bridge class D output stage coupled to drive its speaker as a floating load.

5. The audio amplifier circuit of claim 4 in combination with first, second and third speakers each having a respective pair of inputs, wherein
    the first pair of outputs and the second pair of outputs are coupled to drive the respective pairs of inputs of the first speaker, the second speaker, and the third speaker such that each of two outputs, of the first and second pairs of outputs, is shared by inputs of two of the first, second and third speakers.

6. The audio amplifier circuit of claim 1 wherein each of the first and second amplifiers comprises:
    a first half bridge output stage;
    a first input stage being a summing and differencing amplifier circuit that is to receive the three audio channel signals and provide a first combination thereof to an input of the first half bridge output stage;
    a second half bridge output stage; and
    a second input stage being a summing and differencing amplifier circuit that is to receive the three audio channel signals and provide a second, different combination thereof to an input of the second half bridge output stage.

7. The audio amplifier circuit of claim 6 in combination with first, second and third speakers each having a respective pair of inputs, wherein the first pair of outputs and the second pair of outputs are coupled to drive the respective pairs of inputs of the first speaker, the second speaker, and the third speaker such that each of two outputs, of the first and second pairs of outputs, is shared by inputs of two of the first, second and third speakers.

8. An audio amplifier circuit that is to receive three audio channel signals, comprising:
    a first class D half-bridge amplifier;
    a first input stage being a summing and differencing amplifier circuit that is to receive the three audio channel signals and provide a first combination thereof to a signal input of the first half bridge amplifier;
    a second class D half-bridge amplifier;
    a second input stage being a summing and differencing amplifier circuit that is to receive the three audio channel signals and provide a second combination thereof, to a signal input of the second half bridge amplifier;
    a third class D half-bridge amplifier;
    a third input stage being a summing and differencing amplifier circuit that is to receive the three audio channel signals and provide a third combination thereof, to a signal input of the third half bridge amplifier;
    a fourth class D half-bridge amplifier; and
    a fourth input stage being a summing and differencing amplifier circuit that is to receive the three audio channel signals and provide a fourth combination thereof, to a signal input of the fourth half bridge amplifier.

9. The audio amplifier circuit of claim 8 in combination with first, second and third speakers each having a respective pair of drive inputs, wherein an output of the first half bridge amplifier, an output of the second half bridge amplifier, an output of the third half bridge amplifier, and an output of the fourth half bridge amplifier are coupled to drive the respective pairs of inputs of the first speaker, second speaker and third speaker such that each of two outputs, of the first, second, third and fourth half bridge amplifiers, is shared by drive inputs of two of the first, second and third speakers.

10. The audio amplifier circuit of claim 8 in combination with first, second and third speakers each having a respective pair of drive inputs, wherein
an output of the first half bridge amplifier and an output of the second half bridge amplifier are coupled to drive the respective pair of inputs of the first speaker,
an output of the third half bridge amplifier and an output of the fourth half bridge amplifier are coupled to drive the respective pair of inputs of the second speaker, and
a) one of the respective pair of inputs of the third speaker is coupled to be driven by the output of the first half bridge amplifier or the second half bridge amplifier, and
b) the other one of the respective pair of inputs of the third speaker is coupled to be driven by the output of the third half bridge amplifier or the fourth half bridge amplifier.

11. The audio amplifier circuit of claim 8 wherein the first half bridge amplifier has positive and negative voltage supply inputs.

12. The audio amplifier circuit of claim 8 wherein the summing and differencing amplifier circuit comprises an op-amp based analog summing circuit and an op-amp based differential amplifier or analog subtractor, which operate upon the audio channel signals in analog form to produce an analog combination of the three audio channel signals at the signal input of one of the half bridge amplifiers.

13. The audio amplifier circuit of claim 8 wherein the summing and differencing amplifier circuit comprises:
a digital signal processor that performs summing and subtraction upon the audio channel signals in digital form to produce a digital form of the combination of the three audio channel signals; and
a digital to analog converter that converts the digital form into analog form at the signal input of one of the half bridge amplifiers.

14. A portable electronic audio device comprising:
a laptop, smartphone, tablet, or speaker dock housing having integrated therein
first, second, and third speakers, and
an audio amplifier circuit having three inputs to receive three audio channel signals, respectively, the audio amplifier circuit having
a first amplifier having a first pair of outputs, wherein one of the first pair of outputs is to produce a first combination sum of the three audio channel signals, and the other produces a second, different combination sum of the three audio channel signals, and
a second amplifier having a second pair of outputs, wherein one of the second pair of outputs produces a third, different combination sum of the three audio channel signals and the other produces a fourth, different combination sum of the three audio channel signals,
wherein each of the first, second and third speakers has a respective pair of inputs,
and wherein the first pair of outputs and the second pair of outputs are coupled to drive the respective pairs of inputs of the first speaker, second speaker, and third speaker such that each of two outputs, of the first and second pairs of outputs, is shared by inputs of two of the first, second and third speakers.

15. The portable electronic audio device of claim 14 wherein each of the first and second amplifiers comprises a class D full bridge output stage coupled to drive at least two speaker inputs as a floating load.

16. The portable electronic audio device of claim 14 wherein each of the first and second amplifiers comprises:
a first class D half bridge output stage;
a first input stage being a summing and differencing amplifier circuit that is to receive the three audio channel signals and provide a first combination thereof to an input of the first class D half bridge output stage;
a second class D half bridge output stage; and
a second input stage being a summing and differencing amplifier circuit that is to receive the three audio channel signals and provide a second, different combination thereof to an input of the second class D half bridge output stage.

\* \* \* \* \*